(12) United States Patent
Jeong et al.

(10) Patent No.: US 10,482,961 B2
(45) Date of Patent: Nov. 19, 2019

(54) MEMORY SYSTEM HAVING RESISTIVE MEMORY DEVICE AND OPERATING METHOD THEREOF

(71) Applicant: SK hynix Inc., Gyeonggi-do (KR)

(72) Inventors: Seung-Gyu Jeong, Gyeonggi-do (KR);
Jung-Hyun Kwon, Seoul (KR);
Do-Sun Hong, Gyeonggi-do (KR);
Won-Gyu Shin, Seoul (KR)

(73) Assignee: SK hynix Inc., Gyeonggi-do (KR)

(*) Notice: Subject to any disclaimer, the term of this patent is extended or adjusted under 35 U.S.C. 154(b) by 0 days.

(21) Appl. No.: 16/007,598

(22) Filed: Jun. 13, 2018

(65) Prior Publication Data

US 2019/0164604 A1 May 30, 2019

(30) Foreign Application Priority Data

Nov. 28, 2017 (KR) ........................ 10-2017-0160651

(51) Int. Cl.
*G11C 11/00* (2006.01)
*G11C 13/00* (2006.01)
*G06F 13/40* (2006.01)

(52) U.S. Cl.
CPC ...... *G11C 13/0069* (2013.01); *G06F 13/4068* (2013.01); *G11C 13/003* (2013.01); *G11C 13/0004* (2013.01); *G11C 13/0023* (2013.01); *G11C 13/0061* (2013.01)

(58) Field of Classification Search
CPC ... G11C 7/1006; G11C 7/1048; G11C 7/1012; G11C 7/12; G11C 11/419; G11C 5/025; G11C 5/04; G11C 7/10; G11C 7/1057; G11C 7/1072; G11C 7/1084; G11C 7/22; G11C 8/18; G11C 11/161; G11C 11/165; G11C 11/1653; G11C 11/1659; G11C 11/1673; G11C 11/1675; G11C 11/1693
See application file for complete search history.

(56) References Cited

U.S. PATENT DOCUMENTS

2010/0199017 A1* 8/2010 Hollis ................. G06F 11/1008
710/316

FOREIGN PATENT DOCUMENTS

| KR | 1020140032787 | 3/2014 |
| KR | 1020150050834 | 5/2015 |

* cited by examiner

*Primary Examiner* — Thong Q Le
(74) *Attorney, Agent, or Firm* — IP & T Group LLP

(57) ABSTRACT

A memory system includes a resistive memory device comprising a memory cell array including a plurality of resistive memory cells and a peripheral circuit; and a memory controller suitable for generating data bus inversion (DBI) information which corresponds to write data based on an access history of the resistive memory cell corresponding to an address of the write data, and providing the DBI information, the address and the write data to the peripheral circuit, wherein the peripheral circuit is suitable for selectively inverting the write data based on the DBI information and writing the selectively inverted write data in a memory cell selected according to the address among the resistive memory cells.

20 Claims, 7 Drawing Sheets

MEMORY SYSTEM HAVING RESISTIVE MEMORY DEVICE AND OPERATING METHOD THEREOF

CROSS-REFERENCE TO RELATED APPLICATIONS

This application claims priority under 35 U.S.C. § 119 to Korean Patent Application No. 10-2017-0160651, filed on Nov. 28, 2017, the disclosure of which is incorporated herein by reference in its entirety.

BACKGROUND

1. Field

Various embodiments of the present invention relate to a semiconductor design technique, and more particularly, to a data bus inversion (DBI) operation of a memory system having a resistive memory device.

2. Description of the Related Art

Regarding the demands on high capacity and low-power consumption of semiconductor memory devices, research on next-generation memory devices having non-volatility and not having a refresh have been conducted. The next-generation memory devices include a phase-change random access memory (PRAM) using a phase-change material, a resistive random-access memory (RRAM) using a variable resistance material such as a transition metal oxide, and a magnetic random-access memory (MRAM) using a ferromagnetic material. The resistance of materials consisting of next-generation semiconductor memory elements may be varied in accordance with a voltage or current supplied to memory devices. Even though the current or voltage supply is interrupted, not only do the materials retain the resistance but a high operating speed is also secured.

Particularly, among such resistive memory devices, a PRAM is applicable to various semiconductor systems and semiconductor memory devices because it is non-volatile and can access data at random.

SUMMARY

Various embodiments of the present invention are directed to a memory system that includes a resistive memory device that performs a data bus inversion (DBI) operation based on an access history of a resistive memory cell in consideration of an inhibit disturbance and a thermal disturbance, and an operating method of the memory system.

In accordance with an embodiment of the present invention, a memory system includes: a resistive memory device comprising a memory cell array including a plurality of resistive memory cells and a peripheral circuit; and a memory controller suitable for generating data bus inversion (DBI) information which corresponds to write data based on an access history of the resistive memory cell corresponding to an address of the write data, and providing the DBI information, the address and the write data to the peripheral circuit, wherein the peripheral circuit is suitable for selectively inverting the write data based on the DBI information and writing the selectively inverted write data in a memory cell selected according to the address among the resistive memory cells.

In accordance with an embodiment of the present invention, a memory system includes: a memory cell array including a plurality of resistive memory cells that are disposed at intersection points of a plurality of word lines and a plurality of bit lines and are divided into unit blocks including a predetermined number of adjacent memory cells; a line counting block suitable for counting an access number of a word line and an access number of a bit line corresponding to an address to output a line counting signal; a block counting block suitable for counting an access number of a unit block corresponding to the address to output a block counting signal; a data bus inversion (DBI) control block suitable for giving a weighting to each of the line counting signal and the block counting signal and comparing a weighted line counting signal with a weighted block counting signal to generate data bus inversion (DBI) information corresponding to write data; and a peripheral circuit suitable for selectively inverting the write data based on the DBI information and writing the selectively inverted write data in a memory cell selected according to the address among the resistive memory cells.

In accordance with an embodiment of the present invention, an operating method of a memory system providing a plurality of resistive memory cells that are disposed at intersection points of a plurality of word lines and a plurality of bit lines and are divided into unit blocks including a predetermined number of adjacent memory cells: generating data bus inversion (DBI) information corresponding to write data based on an access history of a resistive memory cell corresponding to an address; and selectively inverting the write data based on the DBI information and writing the selectively inverted write data in a memory cell selected according to the address among the resistive memory cells.

DETAILED DESCRIPTION

Various embodiments of the present invention will be described below in more detail with reference to the accompanying drawings. These embodiments are provided so that this disclosure is thorough and complete. All "embodiments" referred to in this disclosure refer to embodiments of the inventive concept disclosed herein. The embodiments presented are merely examples and are not intended to limit the scope of the invention.

Moreover, it is noted that the terminology used herein is for describing the embodiments only and is not intended to be limiting of the invention. As used herein, singular forms are intended to include the plural forms as well, unless the context clearly indicates otherwise. It will be further understood that the terms "comprises," "comprising," "includes" and/or "including" when used in this specification, indicate the presence of stated features, but do not preclude the presence or addition of one or more other non-stated features. As used herein, the term "and/or" indicates any and all combinations of one or more of the associated listed items. It is also noted that in this specification, "connected/coupled" refers to one component not only directly coupling another component but also indirectly coupling another component through an intermediate component.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

In the following description, numerous specific details are set forth in order to provide a thorough understanding of the present invention. However, it is noted, that the present invention may be practiced without some or all these specific details.

In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated. The drawings are not necessarily to scale and, in some instances, proportions may have been exaggerated to clearly illustrate features of the embodiments.

Figure 1:
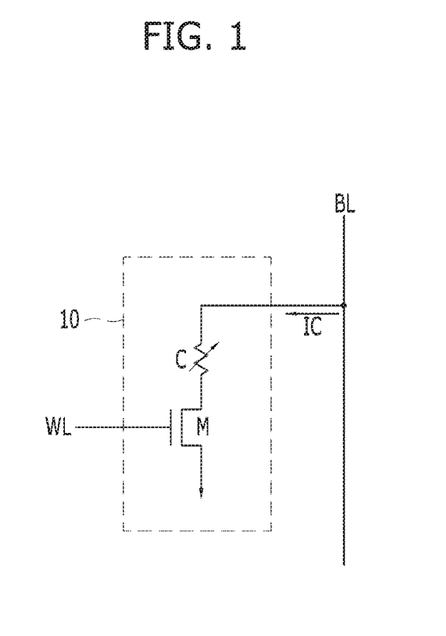
FIG. 1 is a schematic diagram illustrating a memory cell of a resistive memory device.

FIG. 1 is a diagram illustrating a memory cell 10 of a resistive memory device.

Referring to FIG. 1, the memory cell 10 of the resistive memory device may include a variable resistor C and an access transistor M.

The variable resistor C may be coupled to a bit line BL. The access transistor M may be coupled between the variable resistor C and a ground. A gate of the access transistor M may be coupled to a word line WL. When a voltage is applied to the word line WL, the access transistor M may be turned on. When the access transistor M is turned on, the variable resistor C may receive a current IC through the bit line BL.

In an embodiment, the resistive memory device may be composed of a phase-change memory device. For example, the variable resistor C may include a phase-change material such as a chalcogenide alloy changing between a crystalline state and an amorphous state due to a temperature change.

A method using a laser beam and a method using a current are widely known as methods for heating a phase-change material. The method using the current is preferred in terms of ease of implementation of a memory chip. Accordingly, the phase-change memory device may use characteristics of the phase-change material that changes into the crystalline state or the amorphous state according to the current IC supplied through the bit line BL in order to write data.

Figure 2:
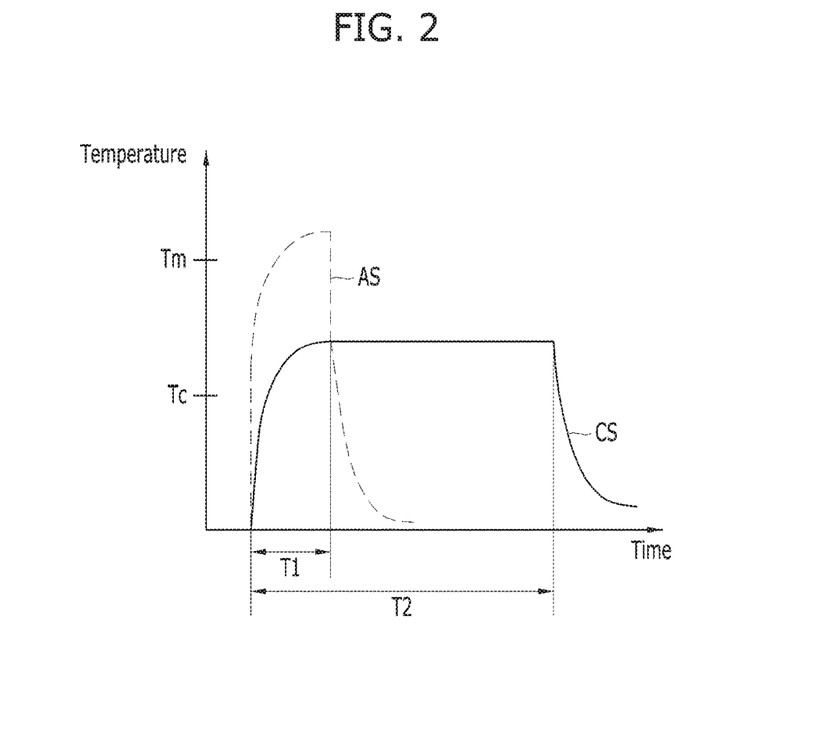
FIG. 2 is a graph for describing characteristics of a phase-change material of a memory cell of a resistive memory device.

FIG. 2 is a graph for describing characteristics of a phase-change material of a memory cell of a resistive memory device, for example, the memory cell 10 of the resistive memory device in FIG. 1.

In FIG. 2, the reference symbol AS represents a condition for causing the phase-change material to change into an amorphous state (hereinafter, referred to as a reset pulse AS), and the reference symbol CS represents a condition for causing the phase-change material to change into a crystalline state (hereinafter, referred to as a set pulse CS).

Referring to FIG. 2, the phase-change material is heated to a temperature higher than a melting temperature Tm due to the reset pulse AS supplied through the bit line, and then rapidly quenched during a first time T1, thereby getting into the amorphous state. The amorphous state is referred to as a reset state, and data at a logic high level ("1") may be stored in the phase-change material in the amorphous state, i.e., the reset state.

Unlike this, the phase-change material is heated to a temperature that is higher than a crystallization temperature Tc and is lower than the melting temperature Tm due to the set pulse CS supplied through the bit lines, and then slowly quenched during a second time T2 longer than the first time T1 (T2>T1), thereby getting into the crystalline state. The crystalline state is referred to as a set state, and data at a logic low level ("0") may be stored in the phase-change material in the crystalline state, i.e., the set state. A resistance of the memory cell is varied with an amorphous volume of the phase-change material. The resistance of the memory cell is the highest in the amorphous state and the lowest in the crystalline state.

A basic operation of the phase-change memory device is described below with reference to FIGS. 1 and 2.

During a write operation of the phase-change memory device, when a voltage is applied to the word line WL, the access transistor M is turned on, and the current Ic is supplied to the variable resistor C, i.e., the phase-change material, through the bit line BL. Accordingly, the variable resistor C gets into the crystalline state or the amorphous state.

The write operation includes a reset operation of writing the data at a logic high level ("1") by transiting a state of the phase-change material into the reset state based on the reset pulse AS and a set operation of writing the low data "0" by transiting the state of the phase-change material into the set state based on the set pulse CS. Since the resistance of the phase-change material in the amorphous state is relatively higher than in the crystalline state, the reset pulse AS applied during the reset operation has a greater peak current than the set pulse CS applied during the set operation. The set pulse CS applied during the set operation is applied for a longer time than the reset pulse AS applied during the reset operation, thereby having a greater current consumption.

During a read operation of the phase-change memory device, when a voltage is applied to the word line WL, the access transistor M is turned on, and a read pulse is supplied to the variable resistor C, i.e., the phase-change material, through the bit line BL. In this case, a state of the phase-change material, that is, data stored in the phase-change material, is determined based on the amount of current depending on the resistance of the phase-change material.

Generally, the write operation of the phase-change memory device may require a great deal of current and long latency to change the state of the phase-change material, whereas the read operation of the phase-change memory device may read values of data by using a small amount of current and short latency because it senses just a present state of the phase-change material.

Meanwhile, the phase-change memory device has been developed to be non-volatile. However, data may be lost due to a drift phenomenon in which the resistance varies as time passes after the data is written in the memory cell.

Particularly, when data is read from or written in a selected memory cell, a threshold value of unselected memory cells, that is, a threshold voltage Vth of the access transistor M, increases although the selected memory cells and the unselected memory cells share the same bit line and word line. Such an effect is referred to as an inhibit disturbance. The inhibit disturbance may affect in units of lines and is vulnerable to the reset pulse due to an increase in the threshold value of the memory cells, resulting in an increase in the probability of malfunction during the reset operation.

In order to increase the degree of integration of a memory device, the distance between memory cells becomes closer to each other, and adjacent memory cells affect each other. In particular, in case of the phase-change memory device, adjacent memory cells are affected by heat (i.e., Joule heating) that occurs when the set pulse or the reset pulse is applied to a selected memory cell. For example, when the selected memory cell is subjected to a temperature of approximately 100° C., memory cells adjacent to the selected memory cell (hereinafter, referred to as adjacent memory cells) are subjected to a temperature of approximately 70° C. which is lower than the temperature of approximately 100° C. Due to such an effect of applying a low temperature, crystallization occurs in adjacent memory cells which are written in the amorphous state (i.e., the reset state), resulting in a read failure where the adjacent memory cells are read to the set state in which the resistance of the memory cells is low. This phenomenon is referred to as a thermal disturbance. The thermal disturbance may affect a periphery of the selected memory cell and increases the probability of malfunction during the set operation.

Hereinafter, in the present invention, a method of performing a data bus inversion (DBI) operation based on an access history of a resistive memory cell in consideration of an inhibit disturbance and a thermal disturbance during the write operation will be described.

In the present invention, a high bit of specific data may be defined as a bit having a logic high value of "1", and a low bit of specific data may be defined as a bit having a logic low value of "0". Also, a major bit may be defined as a bit which takes the most number of bits included in the specific data. For example, when it is assumed that there is data '01100000001', the number of the low bits in the specific data may be 8, and the number of the high bits in the specific data may be 3. In this case, the major bit of the data would be the low bit.

Figure 3:
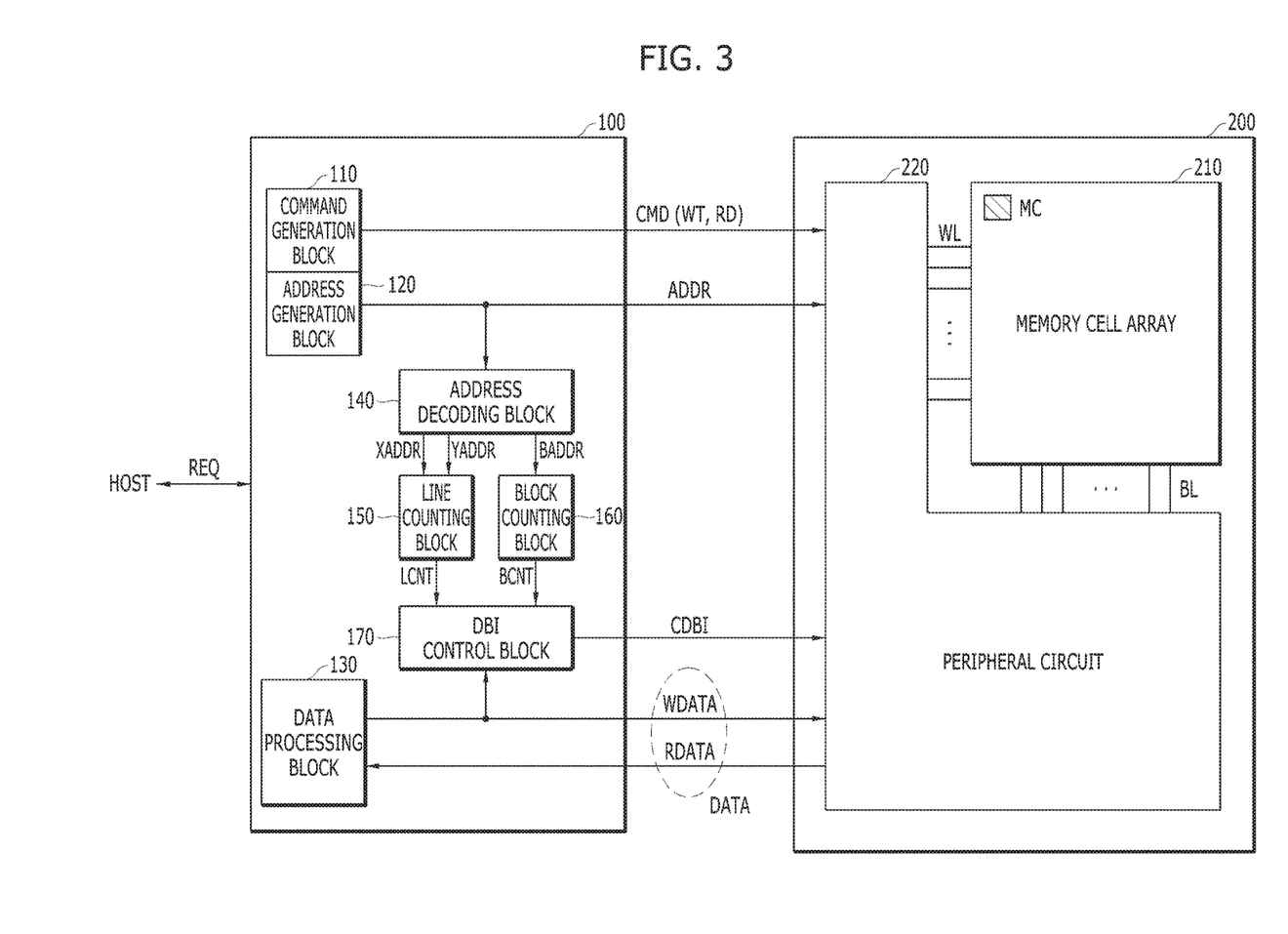
FIG. 3 is a block diagram illustrating a memory system in accordance with an embodiment of the present invention.
Figure 4:
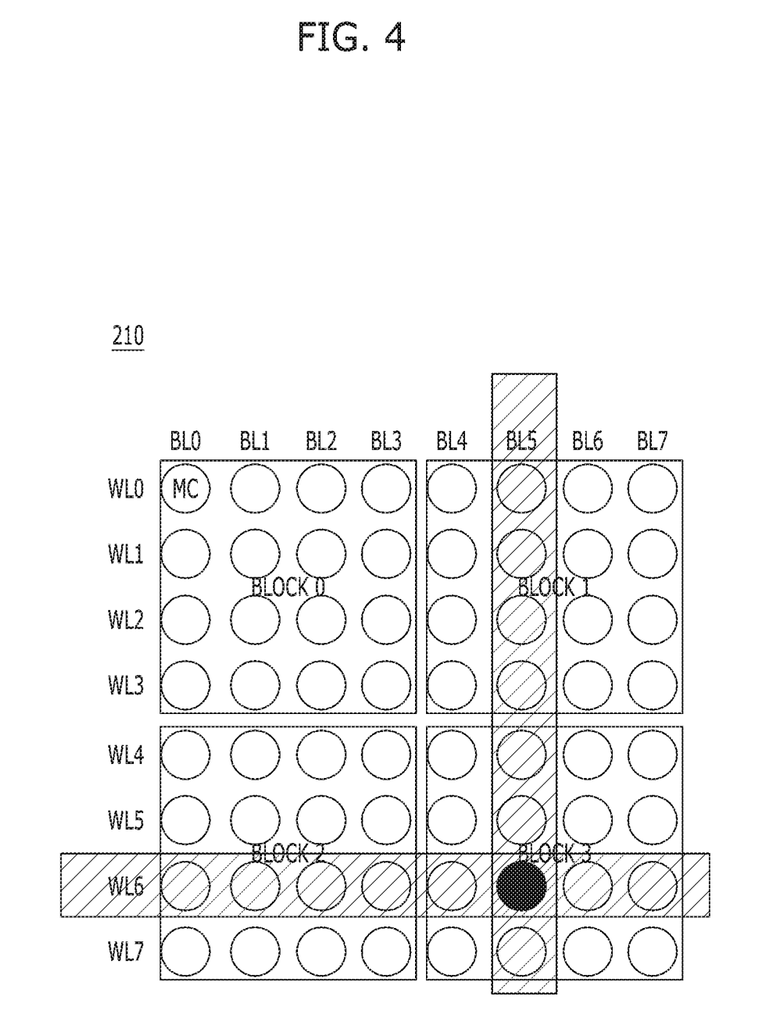
FIG. 4 is a diagram illustrating a memory cell array in accordance with an embodiment of the present invention.

FIG. 3 is a block diagram illustrating a memory system in accordance with an embodiment of the present invention. FIG. 4 is a diagram illustrating a memory cell array in accordance with an embodiment of the present invention, for example, a memory cell array 210 shown in FIG. 3.

Referring to FIG. 3, the memory system may include a memory controller 100 and a memory device 200.

The memory device 200 may include the memory cell array 210 and a peripheral circuit 220. The memory cell array 210 may include a plurality of memory cells MC. The peripheral circuit 220 may be coupled to the memory cells MC through a plurality of word lines WL and a plurality of bit lines BL.

The memory cells MC of the memory cell array 210 may be disposed at intersection points of the word lines WL and the bit lines BL and divided into unit blocks including a predetermined number of adjacent memory cells MC. For example, each of the unit blocks may be configured to include all memory cells MC coupled to a predetermined number of the word lines WL and a predetermined number of the bit lines BL. Referring to FIG. 4, when 64 memory cells MC are disposed at intersection points of first to eighth word lines WL0 to WL7 and first to eighth bit lines BL0 to BL7, the memory cells MC may be divided into first to fourth unit blocks BLOCK0 to BLOCK3, each including 16 memory cells MC disposed at intersection points of four-bit lines and four-word lines. For example, in FIG. 4, a memory cell indicated in black is disposed at an intersection point of the seventh word line WL6 and the sixth bit line BL5 and belongs to the fourth unit block BLOCK3.

Referring back to FIG. 3, the memory cells MC of the memory cell array 210 may be resistive memory cells, which are described above with reference to FIGS. 1 and 2, and the memory device 200 may include a phase-change random access memory (PCRAM). In this case, the peripheral circuit 220 may provide a set pulse or a reset pulse, which corresponds to write data WDATA, to a memory cell (hereinafter, referred to as a "target memory cell") selected according to an address ADDR among the resistive memory cells during a write operation. The write operation may include a reset operation of writing a high bit "1" of the write data WDATA based on the reset pulse and a set operation of writing a low bit "0" of the write data WDATA based on the set pulse.

The memory controller 100 may transmit a command CMD, data DATA and the address ADDR to the memory device 200 for controlling an operation of the memory device 200 in response to a request REQ received from a host. The command CMD may include at least one of a write command WT commanding a write operation and a read command RD commanding a read operation.

For example, when the request REQ received from the host is a write request, the controller 100 may transmit the write command WT, the write data WDATA and the address ADDR corresponding to the target memory cell of the memory cell array 210 to the memory device 200 and control the write operation so that the write data WDATA is programmed in the target memory cell. When the request REQ received from the host is a read request, the controller 100 may transmit the read command RD and the address ADDR corresponding to the target memory cell of the memory cell array 210 to the memory device 200 and control the read operation so that read data RDATA is read out from the target memory cell.

The memory controller 100 may generate data bust inversion (DBI) information CDBI corresponding to the write data WDATA based on an access history of the resistive memory cells corresponding to the address ADDR and provide the DBI information CDBI, the address ADDR and the write data WDATA to the memory device 200. The access history may include an access number of each unit block, an access number of each word line, and an access number of each bit line. The peripheral circuit 220 of the memory device 200 may invert or non-invert the write data WDATA according to the DBI information CDBI, and provide the set pulse or the reset pulse, which corresponds to the write data WDATA, to the memory cell selected according to the address ADDR among the resistive memory cells MC.

More specifically, the memory controller 100 may include a command generation block 110, an address generation block 120, a data processing block 130, an address decoding block 140, a line counting block 150, a block counting block 160, and a DBI control block 170.

The command generation block 110 may generate the command CMD including the write command WT and/or the read command RD when the request REQ is received from the host. Although the command generation block 110 generates commands for various operations, descriptions of the commands will be omitted herein in order to fully explain a conceptual point of the present invention.

The address generation block 120 may generate the address ADDR when the request REQ is received from the host.

The data processing block 130 may generate the write data WDATA when the request REQ received from the host is the write request, and transmit the read data RDATA, which is provided from the memory device 200 when the request REQ received from the host is the read request, to the host.

The address decoding block 140 may decode the address ADDR to generate a row address XADDR for designating the word line WL, a column address YADDR for designating the bit line BL, and a block address BADDR for designating the unit block. Depending on embodiments of the present invention, the address ADDR may not include the block address BADDR. In this case, the address decoding block 140 may generate the block address BADDR based on the row address XADDR and the column address YADDR. When the memory cell array 210 includes a plurality of banks, the address decoding block 140 may decode the address ADDR to generate a bank address for designating each of the banks.

The line counting block 150 may count the access number of the word line corresponding to the row address XADDR and the access number of the bit line corresponding to the column address YADDR to output a line counting signal LCNT.

The block counting block 160 may count the access number of the unit block corresponding to the block address BADDR to output a block counting signal BCNT.

The DBI control block 170 may generate the DBI information CDBI corresponding to the write data WDATA based on the line counting signal LCNT and the block counting signal BCNT. The DBI control block 170 may give a weighting to the line counting signal LCNT and the block counting signal BCNT and generate the DBI information CDBI corresponding to the write data WDATA by comparing a weighted line counting signal WLCNT with a weighted block counting signal WBCNT.

The DBI control block 170 may set the weighting given to the block counting signal BCNT to be greater than the weighting given to the line counting signal LCNT. For example, considering a general tendency, when the number of block accesses for a specific memory cell exceeds 10K, (10000) thermal disturbance may affect adjacent memory cells, thereby increasing the probability of malfunction during the set operation. Also, when the number of line accesses for a specific memory cell, which is the number obtained by adding the access number of the word line and the access number of the bit line, exceeds 100K, (100000), inhibit disturbance may affect adjacent memory cells, thereby increasing the probability of malfunction during the reset operation. Considering this tendency, the DBI control block 170 may set the weighting given to the block counting signal BCNT as 10 while setting the weighting given to the line counting signal LCNT as 1.

When the weighted block counting signal WBCNT is the same as the weighted line counting signal WLCNT, the DBI control block 170 may generate the DBI information CDBI according to a conventional method, i.e., according to a major bit of the write data WDATA. For example, when a low bit of the write data WDATA is the major bit, the DBI control block 170 may determine the DBI information CDBI as "0", and when a high bit of the write data WDATA is the major bit, the DBI control block 170 may determine the DBI information CDBI as "1". However, this is merely an example. When the low bit of the write data WDATA is the major bit, the DBI control block 170 may determine the DBI information CDBI as "1", and when the high bit of the write data WDATA is the major bit, the DBI control block 170 may determine the DBI information CDBI as "0".

When the memory device 200 programs the write data WDATA, the DBI information CDBI may be used as reference information for inverting bits of the write data WDATA. Since in general, the set pulse for writing the low bit of the write data WDATA has a larger power consumption than the reset pulse for writing the high bit of the write data WDATA, a data bus inversion operation may be performed to increase the number of the reset pulse. For example, the memory device 200 may invert the bits of the write data WDATA when the DBI information CDBI is "0", and the memory device 200 may not invert the bits of the write data WDATA when the DBI information CDBI is "1".

When the weighted block counting signal WBCNT is greater than the weighted line counting signal WLCNT, the DBI control block 170 may generate the DBI information CDBI so that the major bit of the write data WDATA is the low bit. The fact that the weighted block counting signal WBCNT is greater than the weighted line counting signal WLCNT indicates that the number of the block accesses is substantially greater than the number of the line accesses, and thus an influence due to the thermal disturbance increases, resulting in a high probability of causing a malfunction during the set operation. Accordingly, the DBI control block 170 may generate the DBI information CDBI so that the major bit of the write data WDATA is the low bit, thereby reducing the number of error bits that may occur in crystallized memory cells under the influence of the thermal disturbance. For example, when the write data WDATA is "000011" and the weighted block counting signal WBCNT is greater than the weighted line counting signal WLCNT, the DBI control block 170 may determine the DBI information CDBI as "1" so that the major bit of the write data WDATA to be written in the memory cell array 210 in actuality is the low bit.

On the other hand, when the weighted block counting signal WBCNT is smaller than the weighted line counting signal WLCNT, the DBI control block 170 may generate the DBI information CDBI so that the major bit of the write data WDATA is the high bit. The fact that the weighted block counting signal WBCNT is smaller than the weighted line counting signal WLCNT may mean that the number of the line accesses is substantially greater than the number of the block accesses, and thus an influence due to the inhibit disturbance increases, resulting in a high probability of causing a malfunction during the reset operation. Accordingly, the DBI control block 170 may generate the DBI information CDBI so that the major bit of the write data WDATA is the high bit, thereby reducing the number of error bits that may occur in memory cells whose threshold value increases under the influence of the inhibit disturbance. For example, when the write data WDATA is "000011" and the weighted block counting signal WBCNT is smaller than the weighted line counting signal WLCNT, the DBI control block 170 may determine the DBI information CDBI as "0" so that the major bit of the write data WDATA to be written in the memory cell array 210 in actuality is the high bit.

As described above, in the present invention, the DBI operation may be performed based on the access history, i.e., the number of the line accesses, of the resistive memory cells in consideration of the inhibit disturbance and the access history, i.e., the number of the block accesses, of the resistive memory cells in consideration of the thermal disturbance during the write operation, whereby the performance of the write operation may be improved and the number of error bits may be reduced by reducing the malfunction.

Although it is described in FIG. 3 that the DBI information CDBI and the write data WDATA are provided as separate signals to the memory device 200, the present invention is not limited to this. According to embodiments, without transmission of the DBI information CDBI, the write data WDATA in which the DBI information CDBI is reflected, that is, which is inverted or non-inverted based on the DBI information CDBI, may be provided to the memory device 200. Although it is illustrated in FIG. 3 for the sake of convenience in description that the command generation block 110, the address generation block 120 and the data processing block 130 are separate components, they may also be implemented as a single component.

Figure 5:
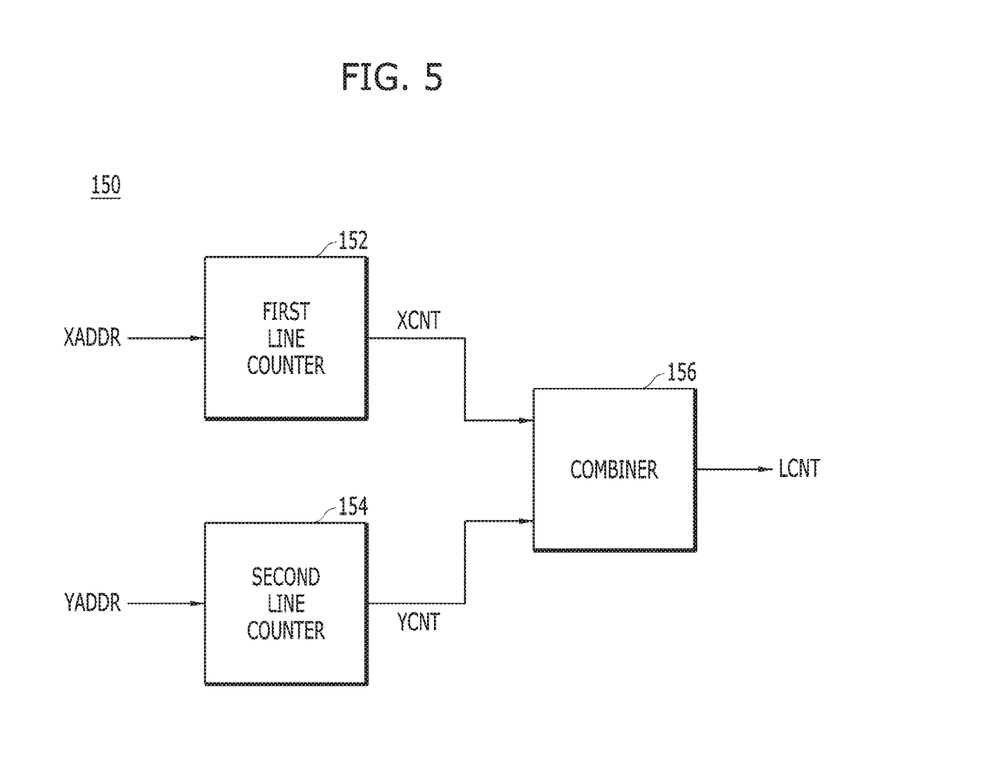
FIG. 5 is a block diagram illustrating a line counting block in accordance with an embodiment of the present invention.

FIG. 5 is a block diagram illustrating a line counting block in accordance with an embodiment of the present invention, for example, the line counting block 150 shown in FIG. 3.

Referring to FIG. 5, the line counting block 150 may include a first line counter 152, a second line counter 154, and a combiner 156.

The first line counter 152 may count the access number of the word line WL corresponding to the row address XADDR to generate a first line counting signal XCNT. In some embodiments, the first line counter 152 may include a plurality of counters (not illustrated) corresponding to each word line WL. When the row address XADDR is received, the first line counter 152 may increase a counting value of the counter corresponding to the word line WL that the row address XADDR designates and output the increased counting value as the first line counting signal XCNT for the corresponding word line WL.

The second line counter 154 may count the access number of the bit line BL corresponding to the column address YADDR to generate a second line counting signal YCNT. In some embodiments, the second line counter 154 may include a plurality of counters (not illustrated) corresponding to each bit line BL. When the column address YADDR is received, the second line counter 154 may increase a counting value of the counter corresponding to the bit line BL that the column address YADDR designates and output the increased counting value as the second line counting signal YCNT for the corresponding bit line BL.

The combiner 156 may combine the first line counting signal XCNT and the second line counting signal YCNT to generate the line counting signal LCNT.

As described above, when an address designating a specific memory cell is received, the line counting block 150 may output the access history for the word line and the bit line of the memory cell, i.e., a value obtained by adding the access number of the word line and the access number of the bit line of the memory cell, as the line counting signal LCNT.

Figure 6:
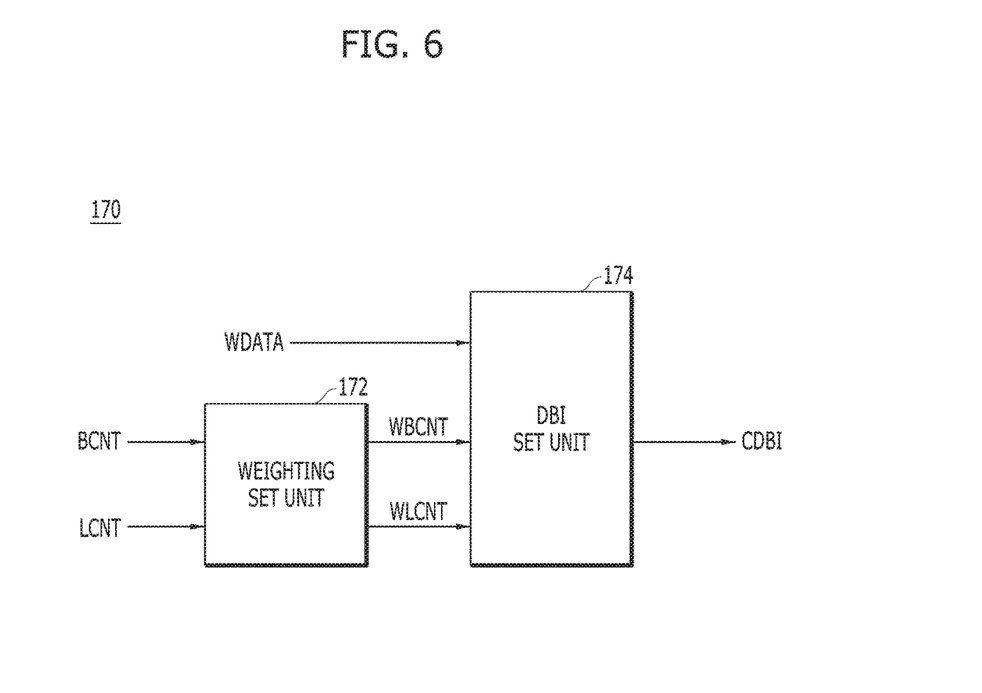
FIG. 6 is a block diagram illustrating a data bus inversion (DBI) control block in accordance with an embodiment of the present invention.

FIG. 6 is a block diagram illustrating a data bus inversion (DBI) control block in accordance with an embodiment of the present invention, for example, the DBI control block 170 shown in FIG. 3.

Referring to FIG. 6, the DBI control block 170 may include a weighting set unit 172 and a DBI set unit 174.

The weighting set unit 172 may give the weighting to each of the line counting signal LCNT and the block counting signal BCNT to output as the weighted line counting signal WLCNT and the weighted block counting signal WBCNT. The weighting set unit 172 may set the weighting given to the block counting signal BCNT to be greater than the weighting given to the line counting signal LCNT. For example, in an embodiment, the weighting set unit 172 may set the weighting given to the block counting signal BCNT as "10" while setting the weighting given to the line counting signal LCNT as "1" as described earlier.

The DBI set unit 174 may compare the weighted line counting signal WLCNT with the weighted block counting signal WBCNT to generate the DBI information CDBI corresponding to the write data WDATA. When the weighted block counting signal WBCNT is the same as the weighted line counting signal WLCNT, the DBI set unit 174 may generate the DBI information CDBI based on the major bit of the write data WDATA. When the weighted block counting signal WBCNT is greater than the weighted line counting signal WLCNT, the DBI set unit 174 may generate the DBI information CDBI so that the major bit of the write data WDATA is the low bit. When the weighted block counting signal WBCNT is smaller than the weighted line counting signal WLCNT, the DBI set unit 174 may generate the DBI information CDBI so that the major bit of the write data WDATA is the high bit.

Figure 7:
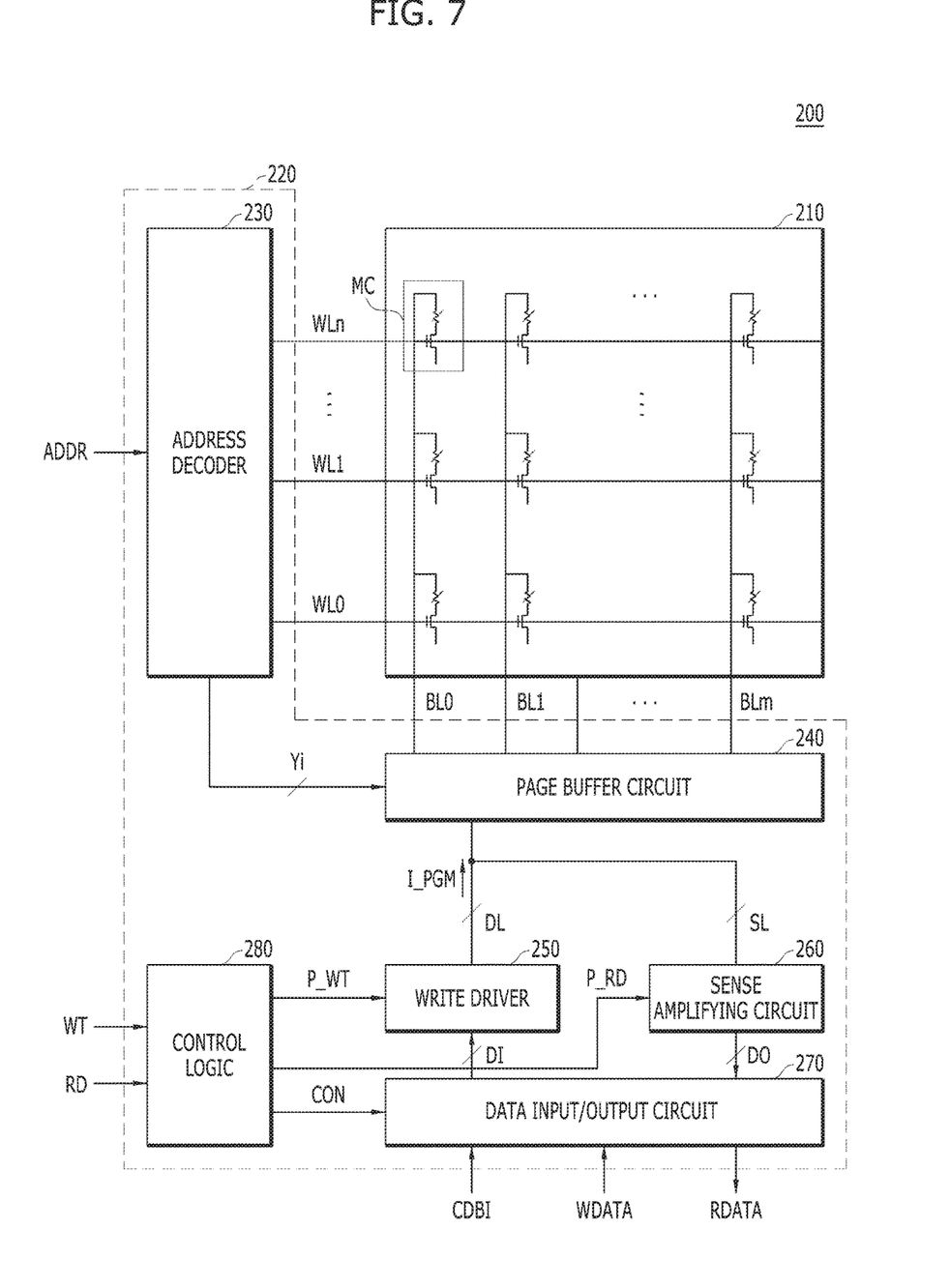
FIG. 7 is a block diagram illustrating a memory device in accordance with an embodiment of the present invention.

FIG. 7 is a block diagram illustrating a memory device in accordance with an embodiment of the present invention, for example, the memory device 200 shown in FIG. 3.

Referring to FIG. 7, the memory device 200 may include the memory cell array 210 and the peripheral circuit 220. FIG. 7 illustrates a case where the memory cells MC of the memory cell array 210 are the resistive memory cells shown in FIGS. 1 and 2.

The peripheral circuit 220 may include an address decoder 230, a page buffer circuit 240, a write driver 250, a sense amplifying circuit 260, a data input/output circuit 270, and a control logic 280.

The control logic 280 may control the address decoder 230, the page buffer circuit 240, the write driver 250, the sense amplifying circuit 260 and the data input/output circuit 270, and may provide a pulse control signal P_WT to the write driver 250, a sense control signal P_RD to the sense amplifying circuit 260, and an input/output control signal CON to the data input/output circuit 270 in response to the write command WT and/or the read command RD.

The address decoder 230 may be coupled to the memory cell array 210 through word lines WL0 to WLn. The address decoder 230 may decode the address ADDR received from an external device and provide a bias voltage to a selected word line. Although not illustrated, the control logic 280 may provide a control signal for controlling the bias voltage to the address decoder 230. Also, the address decoder 230 may generate a selection signal Yi for selecting bit lines BL0 to BLm. The selection signal Yi may be provided to the page buffer circuit 240.

The page buffer circuit 240 may be coupled to the memory cell array 210 through the bit lines BL0 to BLm. The page buffer circuit 240 may select a bit line in response to the selection signal Yi provided from the address decoder 230. The page buffer circuit 240 may couple the bit line BL with a data line DL during the write operation and couple the bit line BL with a sense line SL during the read operation, in response to the selection signal Yi.

The write driver 250 may provide a program pulse I_PGM to the data line DL based on the pulse control signal P_WT and input data DI. The program pulse I_PGM may include the set pulse or the reset pulse.

The sense amplifying circuit 260 may sense a difference between a voltage of the sense line SL and a reference voltage VREF based on the sense control signal P_RD, and may read out data stored in the target memory cell and provide the data as output data DO. The reference voltage VREF may be supplied from a reference voltage generation circuit (not illustrated).

The data input/output circuit 270 may provide the write data WDATA received from an external device as the input data DI based on the input/output control signal CON or output the output data DO provided from the sense amplifying circuit 260 as the read data RDATA to the memory controller (e.g., the reference numeral 100 of FIG. 3). In this case, the data input/output circuit 270 may determine whether or not to invert the bits of the write data WDATA based on the DBI information provided from the DBI control block 170 of the memory controller 100. For example, when the DBI information is "0", since the low bit of the write data WDATA is the major bit, the data input/output circuit 270 may invert the bits of the write data WDATA and provide the inverted bits as the input data DI. When the DBI information is "1", since the high bit of the write data WDATA is the major bit, the data input/output circuit 270 may retain the write data WDATA and provide the write data WDATA as the input data DI.

Hereinafter, an operation of the memory system in accordance with the embodiment of the present invention will be described with reference to FIGS. 1 to 7.

Figure 8:
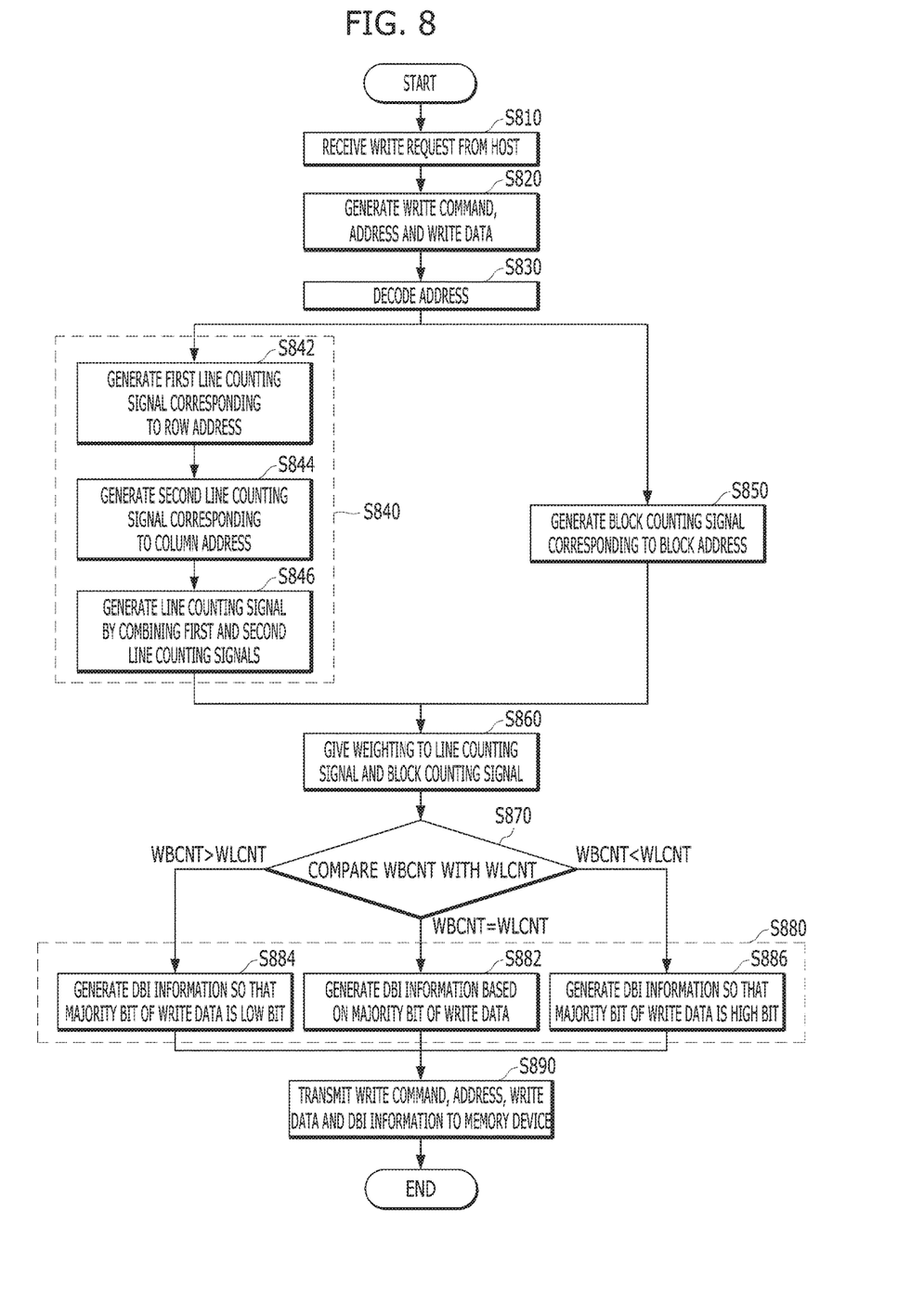
FIG. 8 is a flowchart illustrating an operating method of a memory controller in accordance with an embodiment of the present invention.

FIG. 8 is a flowchart illustrating an operating method of a memory controller in accordance with an embodiment of the present invention, for example, the memory controller 100 shown in FIG. 3.

Referring to FIG. 8, when the write request is received from the host in step S810, the command generation block 110 may generate the write command WT, the address generation block 120 may generate the address ADDR, and the data processing block 130 may generate the write data WDATA, in step S820.

In step S830, the address decoding block 140 may decode the address ADDR to generate the row address XADDR for designating the word line WL, the column address YADDR for designating the bit line BL and the block address BADDR for designating the unit block.

In step S840, the line counting block 150 may count the access number of the word line corresponding to the row address XADDR and the access number of the bit line corresponding to the column address YADDR to output the line counting signal LCNT.

More specifically, in step S842, the first line counter 152 may count the access number of the word line WL corresponding to the row address XADDR to generate the first line counting signal XCNT. In step S844, the second line counter 154 may count the access number of the bit line BL corresponding to the column address YADDR to generate the second line counting signal YCNT. In step S846, the combiner 156 may combine the first line counting signal XCNT and the second line counting signal YCNT to generate the line counting signal LCNT.

In step S850, the block counting block 160 may count the access number of the unit block corresponding to the block address BADDR to output the block counting signal BCNT.

The DBI control block 170 may generate the DBI information CDBI corresponding to the write data WDATA based on the line counting signal LCNT and the block counting signal BCNT.

More specifically, in step S860, the weighting set unit 172 may give the weighting to each of the line counting signal LCNT and the block counting signal BCNT to output the weighted line counting signal WLCNT and the weighted block counting signal WBCNT. The weighting set unit 172 may set the weighting given to the block counting signal BCNT to be greater than the weighting given to the line counting signal LCNT.

The DBI set unit 174 may compare the weighted line counting signal WLCNT with the weighted block counting signal WBCNT in step S870, and generate the DBI information CDBI corresponding to the write data WDATA in step S880.

When the weighted block counting signal WBCNT is the same as the weighted line counting signal WLCNT (WBCNT=WLCNT), the DBI set unit 174 may generate the DBI information CDBI based on the major bit of the write data WDATA in step S882. When the weighted block counting signal WBCNT is greater than the weighted line counting signal WLCNT (WBCNT>WLCNT), the DBI set unit 174 may generate the DBI information CDBI so that the major bit of the write data WDATA is the low bit in step S884. When the weighted block counting signal WBCNT is smaller than the weighted line counting signal WLCNT (WBCNT<WLCNT), the DBI set unit 174 may generate the DBI information CDBI so that the major bit of the write data WDATA is the high bit in step S886.

Subsequently, in step S890, the memory controller 100 may transmit the address ADDR, the write command WT and the write data WDATA and the DBI information CDBI to the memory device 200. Accordingly, the memory controller 100 may generate the DBI information CDBI corresponding to the write data WDATA based on the access history of the resistive memory cell corresponding to the address ADDR.

The control logic 280 of the memory device 200 may generate the pulse control signal P_WT and the input/output control signal CON based on the write command WT. The data input/output circuit 270 may determine whether or not to invert the bits of the write data WDATA based on the DBI information CDBI and provide the write data WDATA as the input data DI based on the input/output control signal CON. The write driver 250 may apply the program pulse I_PGM including the set pulse or the reset pulse to the target memory cell corresponding to the address ADDR based on the pulse control signal P_WT and the input data DI.

Figure 9:
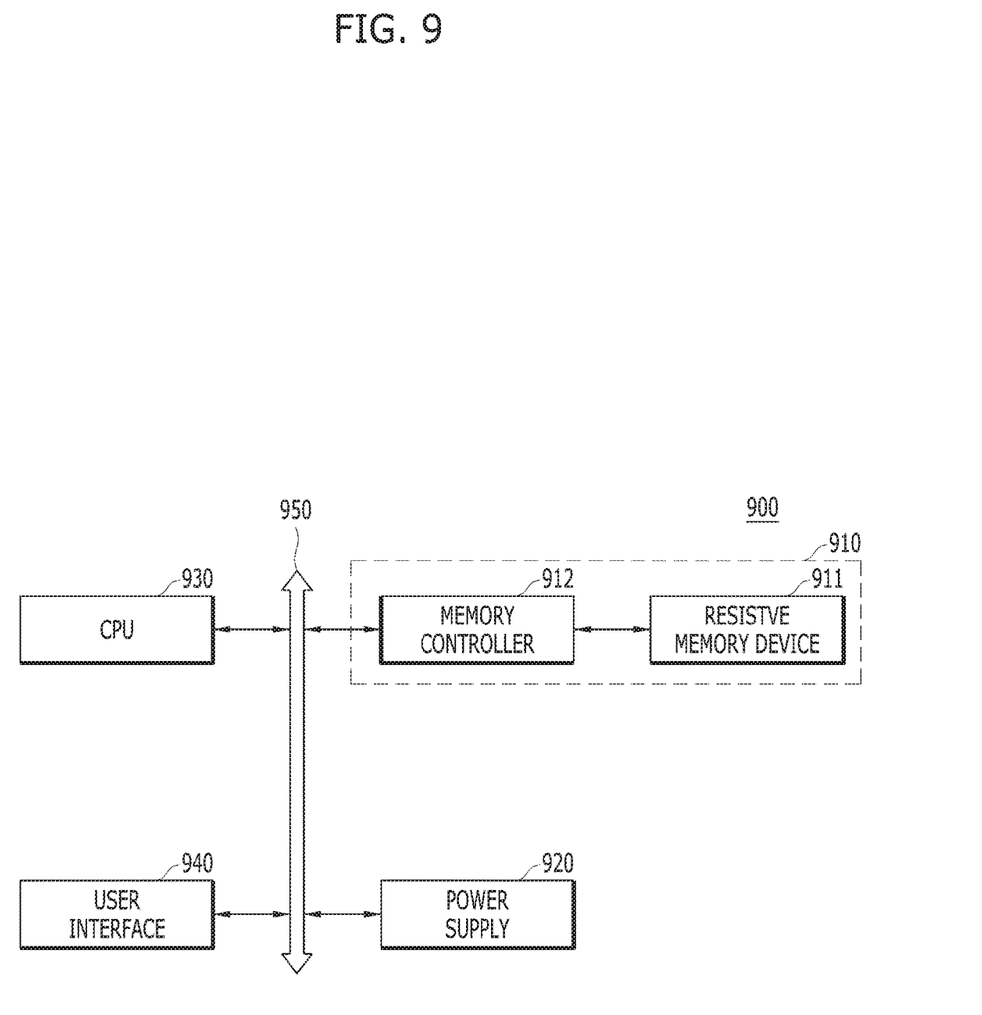
FIG. 9 is a block diagram illustrating a computing system including a resistive memory device in accordance with an embodiment of the present invention.

FIG. 9 is a block diagram illustrating a computing system 900 including a resistive memory device in accordance with an embodiment of the present invention.

Referring to FIG. 9, the computing system 900 may include a memory system 910 including a resistive memory device 911 and a memory controller 912, a central processing unit (CPU) 930 electrically connected to a system bus 950, a user interface 940, and a power supply device 920.

Data, which is provided through the user interface 940 or processed by the CPU 930, may be stored in the resistive memory device 911 through the memory controller 912. The memory system 910 shown in FIG. 9 may be implemented with the memory system shown in FIG. 3. Therefore, a data bus inversion (DBI) operation may be performed based on an access history, i.e., the number of line accesses, of a resistive memory cell in consideration of an inhibit disturbance and an access history, e.g., the number of block accesses, of a resistive memory cell in consideration of a thermal disturbance during a write operation, whereby the performance of the write operation may be improved and the number of error bits may be reduced by reducing the malfunction.

Although not illustrated in the drawing, it is obvious to those skilled in the art that an application chipset, a camera image processor (CIS), a mobile DRAM and the like may be further embodied with the computing system.

As is apparent from the above descriptions, the memory system including the resistive memory device in accordance with the embodiments of the present invention may generate the DBI information based on the access history of the resistive memory cell, thereby improving the performance of the write operation.

In addition, the memory system in accordance with the embodiments of the present invention may invert bits of data based on the DBI information, thereby reducing the malfunction and the number of error bits.

While the present invention has been described with respect to specific embodiments, the embodiments are not intended to be restrictive, but rather descriptive. Further, it is noted that the present invention may be achieved in various other ways through substitution, change, and modification of various features of the described embodiments, by those skilled in the art without departing from the spirit and/or scope of the present invention as defined by the following claims.

What is claimed is:

1. A memory system comprising:
   a resistive memory device comprising a memory cell array including a plurality of resistive memory cells and a peripheral circuit; and
   a memory controller suitable for generating data bus inversion (DBI) information which corresponds to write data based on an access history of the resistive memory cell corresponding to an address of the write data, and providing the DBI information, the address and the write data to the peripheral circuit,
   wherein the peripheral circuit is suitable for selectively inverting the write data based on the DBI information and writing the selectively inverted write data in a memory cell selected according to the address among the resistive memory cells, and
   wherein the peripheral circuit applies a set pulse to the selected memory cell when writing a first logic bit of the write data, and applies a reset pulse to the selected memory cell when writing a second logic bit of the write data.

2. The memory system of claim 1,
   wherein the resistive memory cells are disposed at intersection points of a plurality of word lines and a plurality of bit lines and are divided into unit blocks; and
   wherein the access history includes an access number of each of the word lines, an access number of each of the bit lines, and an access number of each of the unit blocks.

3. The memory system of claim 2, wherein the memory controller includes:
   an address decoding block suitable for decoding the address to generate a row address, a column address, and a block address;
   a line counting block suitable for counting an access number of a word line corresponding to the row address and an access number of a bit line corresponding to the column address to output a line counting signal;
   a block counting block suitable for counting an access number of a unit block corresponding to the block address to output a block counting signal; and
   a data bus inversion (DBI) control block suitable for generating the DBI information corresponding to the write data based on the line counting signal and the block counting signal.

4. The memory system of claim 3, wherein the line counting block includes:
   a first line counter suitable for counting the access number of the word line corresponding to the row address to generate a first line counting signal;
   a second line counter suitable for counting the access number of the bit line corresponding to the column address to generate a second line counting signal; and
   a combiner suitable for combining the first line counting signal and the second line counting signal to generate the line counting signal.

5. The memory system of claim 3, wherein the DBI control block includes:
   a weighting set unit suitable for giving a weighting to each of the line counting signal and the block counting signal; and
   a data bus inversion (DBI) set unit suitable for comparing a weighted line counting signal with a weighted block counting signal to generate the DBI information corresponding to the write data.

6. The memory system of claim 5, wherein the weighting set unit sets the weighting given to the block counting signal to be greater than the weighting given to the line counting signal.

7. The memory system of claim 5, wherein the DBI set unit
   generates the DBI information indicating that a major bit of the write data becomes a high bit when the weighted block counting signal is smaller than the weighted line counting signal,
   generates the DBI information indicating that the major bit of the write data becomes a low bit when the weighted block counting signal is greater than the weighted line counting signal, and
   generates the DBI information based on the major bit of the write data when the weighted block counting signal is the same as the weighted line counting signal.

8. The memory system of claim 1, wherein the first logic bit of the write data includes a low bit and the second logic bit of the write data includes a high bit.

9. A memory system comprising:
   a memory cell array including a plurality of resistive memory cells that are disposed at intersection points of a plurality of word lines and a plurality of bit lines and are divided into unit blocks including a predetermined number of adjacent memory cells;
   a line counting block suitable for counting an access number of a word line and an access number of a bit line corresponding to an address to output a line counting signal;
   a block counting block suitable for counting an access number of a unit block corresponding to the address to output a block counting signal;
   a data bus inversion (DBI) control block suitable for giving a weighting to each of the line counting signal and the block counting signal and comparing a weighted line counting signal with a weighted block counting signal to generate data bus inversion (DBI) information corresponding to write data; and
   a peripheral circuit suitable for selectively inverting the write data based on the DBI information and writing the selectively inverted write data in a memory cell selected according to the address among the resistive memory cells.

10. The memory system of claim 9, wherein the line counting block includes:
a first line counter suitable for counting the access number of the word line corresponding to a row address of the address to generate a first line counting signal;
a second line counter suitable for counting the access number of the bit line corresponding to a column address of the address to generate a second line counting signal; and
a combiner suitable for combining the first line counting signal and the second line counting signal to generate the line counting signal.

11. The memory system of claim 9, wherein the DBI control block sets the weighting given to the block counting signal to be greater than the weighting given to the line counting signal.

12. The memory system of claim 9, wherein the DBI control block
generates the DBI information indicating that a major bit of the write data becomes a high bit when the weighted block counting signal is smaller than the weighted line counting signal,
generates the DBI information indicating that the major bit of the write data becomes a low bit when the weighted block counting signal is greater than the weighted line counting signal, and
generates the DBI information based on the major bit of the write data when the weighted block counting signal is the same as the weighted line counting signal.

13. An operating method of a memory system, comprising:
providing a plurality of resistive memory cells that are disposed at intersection points of a plurality of word lines and a plurality of bit lines and are divided into unit blocks including a predetermined number of adjacent memory cells:
generating data bus inversion (DBI) information corresponding to write data based on an access history of a resistive memory cell corresponding to an address; and
selectively inverting the write data based on the DBI information and writing the selectively inverted write data in a memory cell selected according to the address among the resistive memory cells, by applying a set pulse to the selected memory cell when a first logic bit of the write data is written, and applying a reset pulse to the selected memory cell when a second logic bit of the write data is written.

14. The operating method of claim 13, wherein the access history includes an access number of each of the word lines, an access number of each of the bit lines, and an access number of each of the unit blocks.

15. The operating method of claim 13, wherein the generating of the DBI information includes:
generating a row address, a column address and a block address by decoding the address;
outputting a line counting signal by counting an access number of a word line corresponding to the row address and an access number of a bit line corresponding to the column address;
outputting a block counting signal by counting an access number of a unit block corresponding to the block address; and
generating the DBI information corresponding to the write data based on the line counting signal and the block counting signal.

16. The operating method of claim 15, wherein the outputting of the line counting signal includes:
generating a first line counting signal by counting the access number of the word line corresponding to the row address;
generating a second line counting signal by counting the access number of the bit line corresponding to the column address; and
generating the line counting signal by combining the first line counting signal and the second line counting signal.

17. The operating method of claim 15, wherein the generating of the DBI information corresponding to the write data based on the line counting signal and the block counting signal includes:
giving a weighting to each of the line counting signal and the block counting signal; and
generating the DBI information corresponding to the write data by comparing a weighted line counting signal with a weighted block counting signal.

18. The operating method of claim 17, wherein the giving of the weighting to each of the line counting signal and the block counting signal is carried out to set the weighting given to the block counting signal to be greater than the weighting given to the line counting signal.

19. The operating method of claim 17, wherein the generating of the DBI information corresponding to the write data by comparing the weighted line counting signal with the weighted block counting signal includes:
generating the DBI information indicating that a major bit of the write data becomes a high bit when the weighted block counting signal is smaller than the weighted line counting signal;
generating the DBI information indicating that the major bit of the write data becomes a low bit when the weighted block counting signal is greater than the weighted line counting signal; and
generating the DBI information based on the major bit of the write data when the weighted block counting signal is the same as the weighted line counting signal.

20. The operating method of claim 13, wherein the first logic bit of the write data includes a low bit of the write data, and the second logic bit of the write data includes a high bit.

* * * * *